United States Patent [19]
Gillis et al.

[11] Patent Number: 5,917,285
[45] Date of Patent: Jun. 29, 1999

[54] APPARATUS AND METHOD FOR REDUCING OPERATING VOLTAGE IN GAS DISCHARGE DEVICES

[75] Inventors: Harry P. Gillis, Los Angeles; Dmitri A. Choutov, Santa Clara, both of Calif.; Kevin P. Martin, Altanta, Ga.

[73] Assignee: Georgia Tech Research Corporation, Atlanta, Ga.

[21] Appl. No.: 08/899,341

[22] Filed: Jul. 23, 1997

Related U.S. Application Data

[63] Continuation-in-part of application No. 08/705,902, Aug. 28, 1996
[60] Provisional application No. 60/022,364, Jul. 24, 1996.

[51] Int. Cl.$^6$ .................................................... H01J 17/04
[52] U.S. Cl. ............................................. 313/632; 313/631
[58] Field of Search ..................................... 313/631, 632, 313/618, 348, 349, 352, 356

[56] References Cited

U.S. PATENT DOCUMENTS

| | | | |
|---|---|---|---|
| 1,712,407 | 5/1929 | Skaupy | 313/611 |
| 2,037,075 | 4/1936 | Haines | 313/356 |
| 3,304,456 | 2/1967 | De Lany et al. | 313/618 |
| 4,450,787 | 5/1984 | Weakliem | 118/723 |
| 4,496,881 | 1/1985 | Cheever | 315/357 |
| 4,874,459 | 10/1989 | Coldren | 156/643 |
| 5,039,376 | 8/1991 | Zukotynski | 156/643 |
| 5,331,249 | 7/1994 | Minamikata et al. | 313/632 |
| 5,352,953 | 10/1994 | Wakabayashi et al. | 313/632 |
| 5,368,676 | 11/1994 | Nagaseki | 156/345 |
| 5,418,423 | 5/1995 | Murray | 313/632 |
| 5,457,298 | 10/1995 | Nelson | 219/121 |
| 5,572,088 | 11/1996 | Aizawa et al. | 313/632 |

OTHER PUBLICATIONS

A.P. Webb & S. Veprek, Reactivity of Solid Silicon with Hydrogen Under Conditions of a Low Pressure Plasma, Chemical Physics Letter, 62 (1) P 173 (1979).

S. Veprek & F.A. Sarott, Electron–Impact–Induced Anisotropic Etching of Silicon by Hydrogen, Plasma Chemistry & Plasma Processing, 2(3) P. 233 (1982).

H.P. Gillis, J.L. Clemons & J.P. Chamberlain, Low–Energy Electron Beam Enhanced Etching of Si(100) –(2×1) by Molecular Hydrogen, J.Vac. Sci. Technol. B 10(6), P. 2729 (1992).

S. Vaprek et al., "The Preparation Of Thin Layers Of Ge And Si By Chemical Hydrogen Plasma Transport," Solid–State Electronics Pergamon Press 1968, vol. 11, pp. 683–684.

S. Veprek et al., "Parameters Controlling The Deposition Of Amorphous And Microcrystalline Silicon In Si/H Discharge Plasmas," Journal De Physique (Paris) 42, C4–251 (1981).

S. Veprek, "Highlights Of Preparative Solid State Chemistry In Low Pressure Plasmas," Pure & Appl. Chem., vol. 54, No. 6, pp. 1197–1220, 1982.

H.P. Gillis et al., "Low Energy Electron–Enhanced Etching Of Si(100) In Hydrogen/Helium Direct–Current Plasma," Appl. Phys. Lett. 66 (19), May 8, 1995.

H.P. Gillis et al., "Low Energy Electron–Enhanced Etching Of GaAs(100) In A Chlorine/Hydrogen DC Plasma," Appl. Phys. Lett. 68 (16), Apr. 15, 1996.

(List continued on next page.)

*Primary Examiner*— Nimeshkumar D. Patel
*Attorney, Agent, or Firm*—Thomas, Kayden, Horstemeyer & Risley, L.L.P.

[57] ABSTRACT

The present invention is a system and method for reducing the voltage necessary to produce a glow discharge in a gas. This is done by fabricating the cathode in a gas discharge device out of a conductive material that is permeable to the subject gas rather than out of a solid material, as in the prior art. Fabricating the cathode with a permeable material rather than a solid material increases the surface area of the cathode and provides the gas with greater access to the cathode's surface. Increasing the surface area of the cathode increases the total discharge current which can be extracted from the cathode without increasing the extraction voltage. This allows the gas discharge device to be operated at a lower voltage than is possible using a cathode fabricated of a solid material.

14 Claims, 6 Drawing Sheets

OTHER PUBLICATIONS

H.P. Gillis et al., "Low Energy Electron–Enhanced Etching Of GaN/Si In Hydrogen Direct Current Plasma," J. Electrochem Soc., vol. 143, No. 11, Nov. 1996.

H.P. Gillis et al., "The Dry Etching Of Group III–Nitride Wide–Bandgap Semiconductors," Journal of Materials, 48, 50–55 (1996).

E. Wiberg et al., "Hydrides of the Elements of Main Groups I–IV," New York, 1971, Chapter 6, pp. 443–460.

P. Breisacher et al., "Comparative Stabilities Of Gaseous Alane, Gallane, And Indane," Journal of the American Chemical Society, pp. 4255–4258, 87:19, Oct. 5, 1965.

K. Choquette et al., "Hydrogen Plasma Processing Of GaAs And AlGaAs," J. Vac. Sci. Technol. B, vol. 11, No. 6, Nov./Dec. 1993, pp. 2025–2032.

J.R. Creighton, "Hydrogen Chemisorption And Reaction On GaAs(100)," J. Vac. Sci. Technol. A 8 (6), Nov./Dec. 1990, pp. 3984–3987.

H.P. Gillis et al., "Highly Anisotropic, Ultra–Smooth Patterning Of GaN/SiC By Low Energy Electron Enhanced Etching In DC Plasma," Journal of Electronic Materials (Special Issue, Mar. 1997), citation: J. Electronic Mat. 26, 301–305 (1997), pp. 1–16.

Heiji Watanabe et al., "Electron–Beam–Assisted Dry Etching For GaAs Using Electron Cyclotron Resonance Plasma Electron Source," Appl. Phys. Lett. 61 (25), Dec. 21, 1992, pp. 3011–3013.

APPARATUS AND METHOD FOR REDUCING OPERATING VOLTAGE IN GAS DISCHARGE DEVICES

CROSS REFERENCE TO RELATED APPLICATIONS

The present application claims priority to and the benefit of the filing date of Provisional Patent Application Serial No. 60/022,364, filed Jul. 24, 1996, entitled "Permeable Wall Hollow Cathode," which is hereby incorporated by reference in this application in its entirety. The present application is a continuation-in-part of U.S. patent application Ser. No. 08/705,902 of Martin, et al., filed Aug. 28, 1996, entitled "Method and Apparatus for Low Energy Electron Enhanced Etching of Substrates."

FIELD OF THE INVENTION

The present invention generally relates to the field of gas discharge devices, including for example but not limited to, neon signs and gas lasers.

BACKGROUND OF THE INVENTION

Glow discharge in gases, also known as cold cathode discharge, is widely used in a variety of devices for such applications as advertising, illumination, and decoration. This technology is also useful for a variety of other applications, including materials processing. Some common examples of gas discharge devices are neon signs and gas lasers.

Gases able to sustain glow discharges, including but not limited to neon, are well known in the art. A gas discharge is generated when sufficient electrical current flows between the cathode and the anode in a chamber, known as a discharge tube or plasma reactor, that is filled with a suitable reactive gas, such as neon. If the cathode is capable of producing the discharge without the application of heat, the cathode is known as a cold cathode.

In order to supply the current flow necessary to generate the glow discharge, a voltage is applied between the cathode and the anode from an external power source. A major drawback to the technology is that very high operating voltages are required. Depending on the geometrical dimensions of the enclosure and the nature of the filling gas, operating voltages up to and exceeding 15 kV may be required to generate a glow discharge in the gas.

Because of the high voltages required to generate a glow discharge, one of the key design parameters for gas discharge devices is aimed at producing the highest possible glow discharge current while minimizing the required operating voltage. The operating voltage is proportional to the electron work function of the material comprising the cathode, and inversely proportional to the cathode's surface area. Thus, for a given cathode material, the operating voltage can be reduced by increasing the surface area of the cathode. The cathode's surface area may be increased simply by increasing the physical dimensions of the cathode, but because the cathode must be contained within the discharge tube, this would require increasing the physical size of the discharge tube to accommodate the larger cathode. This is an undesirable result in many applications.

Hence, a heretofore unaddressed need exists in the industry for a gas discharge device that can be operated at a lower voltage than presently available devices without increasing the physical size of the device.

SUMMARY OF THE INVENTION

The present invention overcomes the inadequacies and deficiencies of the prior art as noted above and as generally known in the industry by forming the cathode of a gas discharge device out of a conductive material that is permeable to the subject gas. In a preferred embodiment, the cold cathode is a hollow cathode with an outer wall formed with a permeable, meshed, or perforated material (generally referred to herein as permeable), rather than the typical solid wall formation of the prior art. The cathode, in a preferred embodiment, may be cylindrically shaped with a side wall of a permeable conductive material, such as stainless steel mesh, and having one end that is open or closed and an open end. The cathode is mounted within the discharge tube and connected to an external power supply using conventional means.

The permeable wall configuration increases the cathode's surface area without increasing its physical size. The use of a permeable wall cathode therefore allows the generation of a larger flux of ions from the reactive gas at lower pressure and temperature than a solid wall configuration of the same size.

With the exception of the requirements that the cathode have an open end and the ability to be connected to a power supply, there are no fundamental limitations on the configuration of the cathode. Additional embodiments may include, but not be limited to, a configuration comprising a plurality of nested side walls and a multiple wall configuration constructed of a single piece of mesh material formed into a spiral shape. These examples are not intended to limit the generality of the invention, and there is no fundamental limitation on the various configurations that can be used in accordance with the present invention.

Other objects, features, and advantages of the present invention will become apparent to one with skill in the art upon examination of the drawings and the following detailed description. All such additional objects, features and advantages are intended to be included herein within this disclosure.

BRIEF DESCRIPTION OF THE DRAWINGS

The present invention can be better understood with reference to the following drawings. The drawings are not necessarily to scale, emphasis instead being placed upon clearly illustrating principles of the present invention. Furthermore, in the figures, like reference numerals designate corresponding parts throughout the several views.

DETAILED DESCRIPTION OF THE PREFERRED EMBODIMENTS

Figure 1:
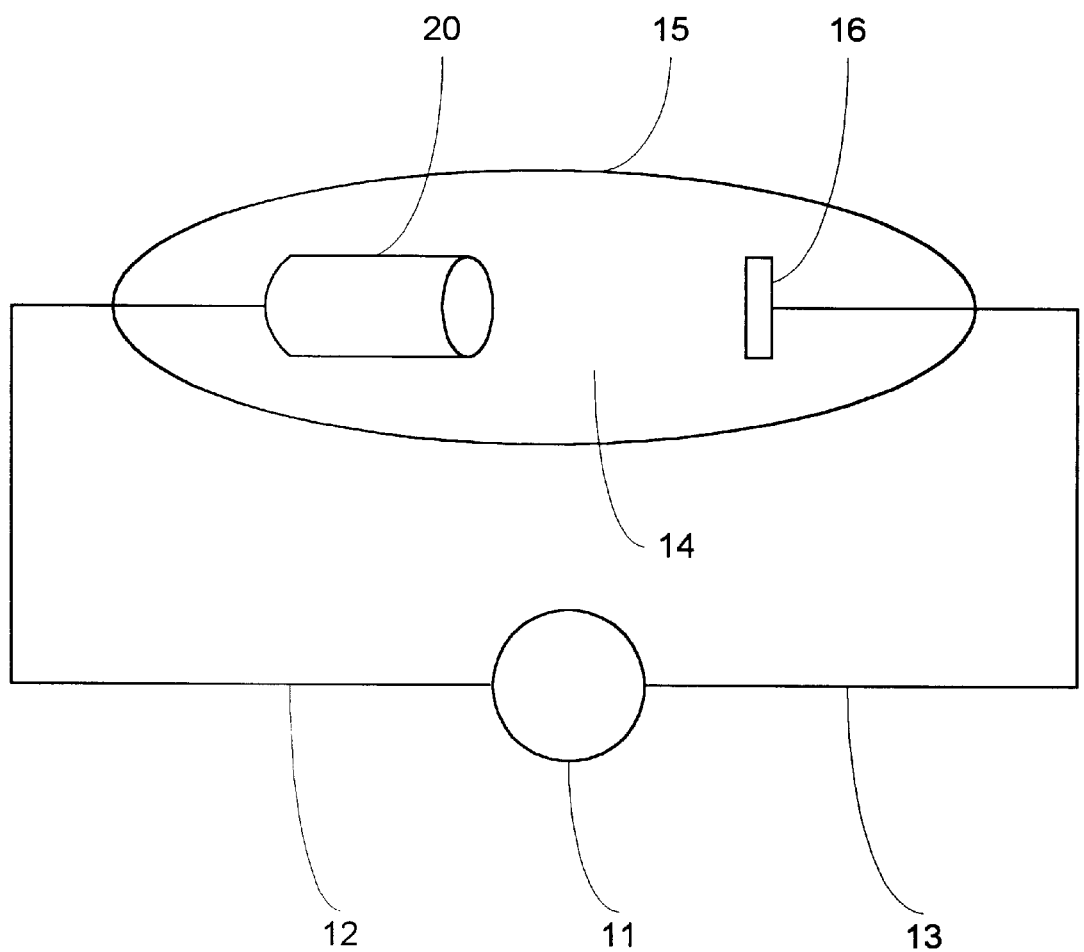
FIG. 1 is a schematic diagram showing a generalized system for a gas discharge device with the cathode configured in accordance with the present invention.

With reference now to the drawings wherein like reference numerals designate corresponding parts throughout the several views, FIG. 1 illustrates a generalized system for a gas discharge device configured in accordance with the present invention. Two electrodes, a cathode 20 and an anode 16, are enclosed with a gas 14 in a discharge tube 15. The gas 14 is chosen from the group of glow discharge gases that are well known in the art. The cathode 20 is configured of a conductive material that is permeable to the gas. The anode 16 is a conventional electrode. The cathode and anode are mounted within the discharge tube in the desired orientation and connected to an external high voltage power supply 11 via electrical connections 12 and 13, respectively, using conventional means. The connections through the end walls of the discharge tube are maintained vacuum-tight. When sufficient voltage is applied between the cathode and anode, a current is induced through the gas and a glow discharge is produced in the gas. It is well known in the art that for a particular pressure and discharge gas, the glow discharge operating voltage is proportional to the electron work function of the cathode material and inversely proportional to the cathode's surface area.

A preferred embodiment of the system of FIG. 1 consists of a 2 inch inside diameter glass tube approximately 30 inches long that has separate gas inlet and pump-out ports at opposite ends of the tube. The inlet port is used to control the flow of gases into the system and is connected to a gas flow manifold consisting of flow control valves, pressure regulators, and gas storage cylinders arranged and connected using conventional means known to persons of ordinary skill in the art. A pumping line is used to evacuate gas in the system and is connected to a throttle valve, liquid nitrogen cold trap and a mechanical pump by conventional means. Demountable glass end caps are clamped to either end of the large tube. An vacuum tight seal is achieved between the end caps and the glass tube by means of a compressible elastomer O-ring. A ¼ inch diameter stainless steel rod passes through the wall of one end cap by means of a vacuum-tight seal. The stainless steel rod extends into the glass tube approximately 6 inches. The permeable cathode is spot welded to the end of the rod that is inside the tube. The end of the rod that extends outside the tube is connected electrically to a power supply. The body of the cathode is approximately 1 inch in diameter and 3 inches long and is formed from a stainless steel screen mesh with approximately 1 mm openings in the screen and having approximately a 50% fill factor. Another ¼ inch diameter stainless steel rod passes through a vacuum-tight seal in the other endcap. A 1 inch diameter stainless steel flange is welded to the end of this rod that is inside the tube. The flange and rod assembly forms the anode in the system. The end of the rod that extends outside the tube is connected electrically to the power supply.

This system has been used to create a glow discharge in hydrogen, chlorine, helium, nitrogen, argon, and mixtures of these gases at pressures ranging from 10 m Torr to several Torr. The current through the glow discharge has varied from a few to several hundred millamps at voltages exceeding 3 kV.

Figure 2A:
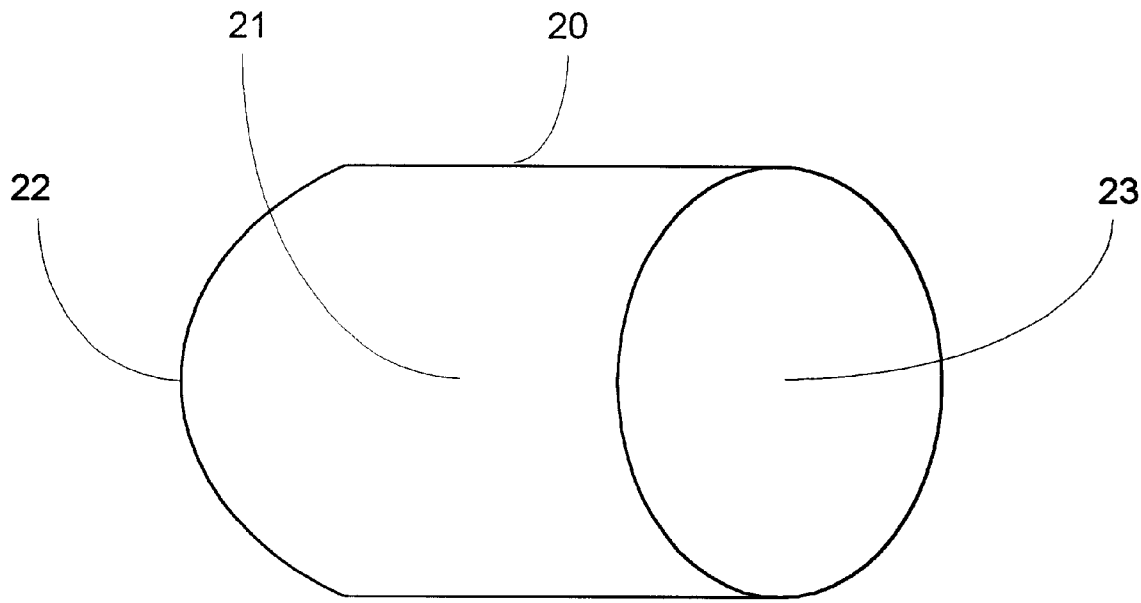
FIG. 2A is a schematic diagram showing the front view of a cathode configured in accordance with a first embodiment of the present invention.
Figure 2B:
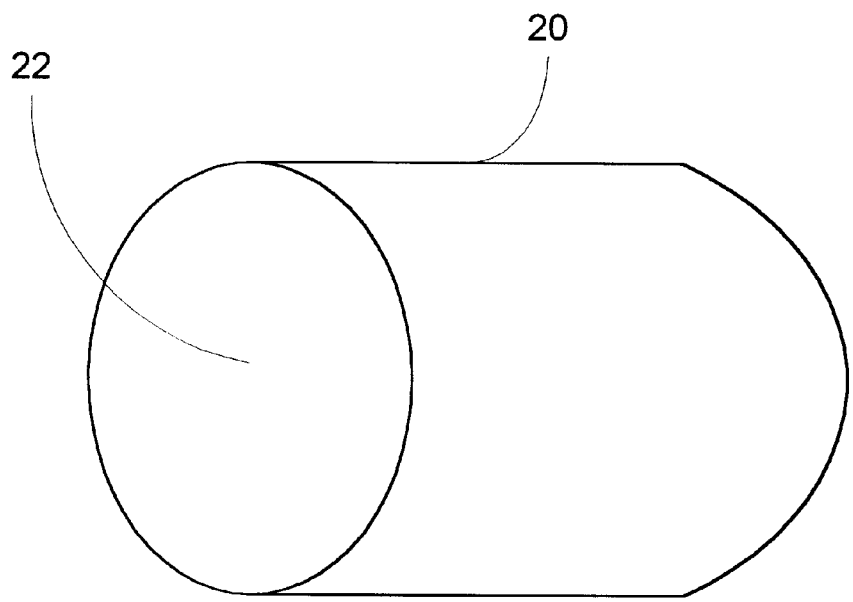
FIG. 2B is a schematic diagram showing the rear view of the cathode of FIG. 2A.

FIGS. 2A and 2B illustrate front and rear views, respectively, of a first embodiment of the cathode 20 illustrated in the system of FIG. 1. The cathode 20 is a permeable wall hollow cathode having a tubular wall 21 made of a permeable, meshed, or perforated conductive material such as stainless steel mesh. The material is chosen so that the gas 14 can pass through the openings in the material. The cathode has two ends: a first, open end 23, and a second end 22, which is connected to the power supply using conventional means. The second end can be open or closed with an end piece (not shown). If an end piece is used, the end piece may be made of a solid or permeable material.

Other materials such as aluminum may be preferred for the cathode material and the cathode may be coated with gold or other conducting material. Different materials also may be preferred for different reactive gases. Due to the proportional relationship between the operating voltage and the electron work function of the cathode material, materials with low work functions are preferred. Another important aspect is that the material should not react with or interfere with the reactive gas.

Referring again to FIGS. 2A and 2B, the gas can flow into and out of the hollow interior of the cathode through the open end 23 as well as through the permeable outer body wall 21 of the cathode 20. By constructing the cathode from a permeable material rather than from a solid material, the present invention increases the cathode's surface area without increasing its physical size and allows for greater movement of the gas within the discharge tube, which allows the generation of a larger flux of ions from the reactive gas at lower pressure and temperature than a solid wall configuration.

Figure 3:
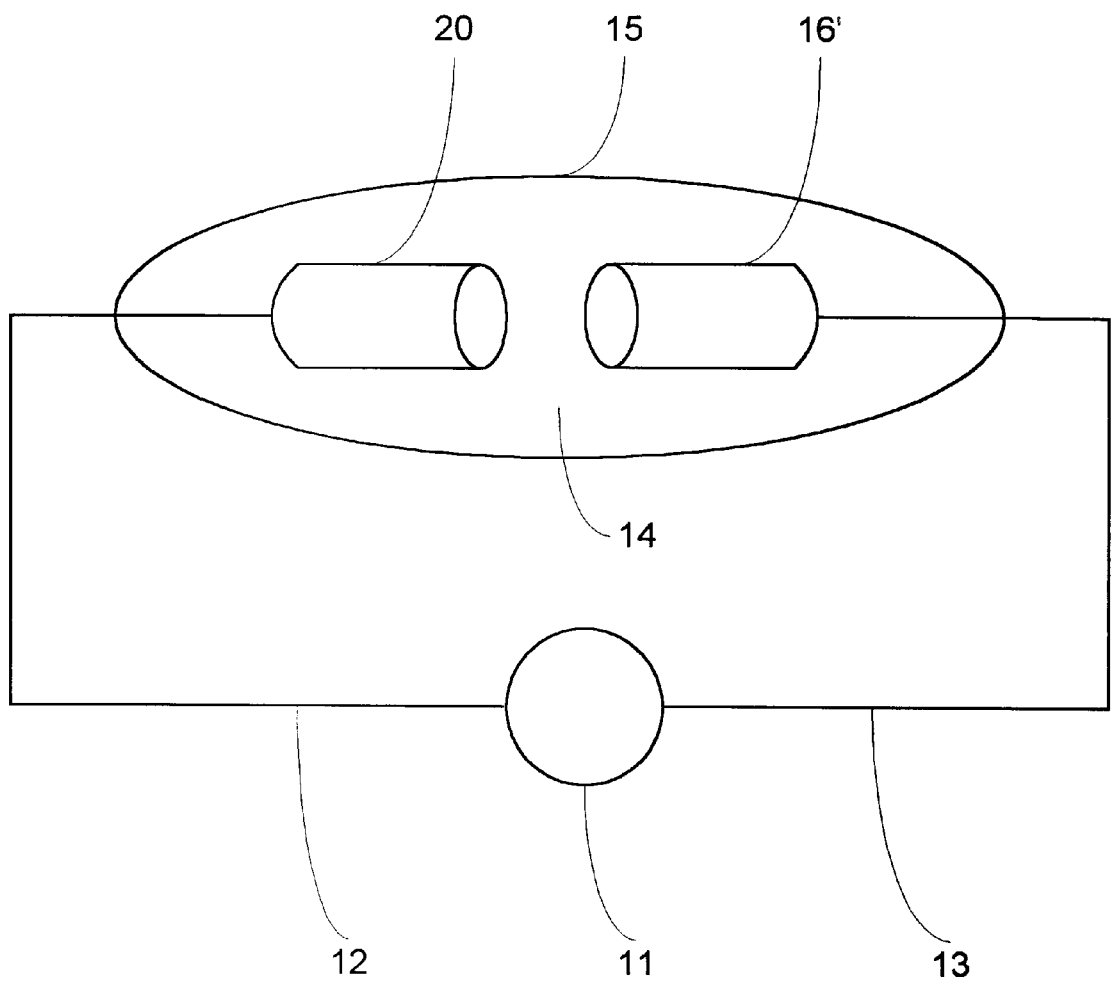
FIG. 3 is a schematic diagram showing a generalized system for a gas discharge device with both the cathode and the anode configured in accordance with the present invention.

For some glow discharge applications, such as those using a direct current (DC) power supply, it is only necessary to configure the cathode from a permeable material in order to achieve the advantages of the present invention. In such applications, the anode may be of a conventional configuration. In other applications, however, it may be desirable to configure both of the electrodes from a permeable material. For example, in applications using alternating current (AC), either alone or in combination with a direct current (DC), each of the electrodes functions as the cathode during alternating portions of the cycle. In these applications, it is desirable to configure both of the electrodes from a material permeable to the subject gas to increase the cathode surface area during the entire cycle. FIG. 3 illustrates a system in which both of the electrodes are configured from a permeable material. The system of FIG. 3 is identical to the system of FIG. 1 with the exception that both the cathode 20 and the anode 16 are configured of a permeable material, as illustrated in FIGS. 2A and 2B. Although the cathode and anode are depicted in FIG. 3 as having identical geometries, this is not required and should not be interpreted as a limitation of the invention. In fact, there is no such limitation and the cathode and anode of the system depicted in FIG. 3 need not be identically configured.

Figure 4A:
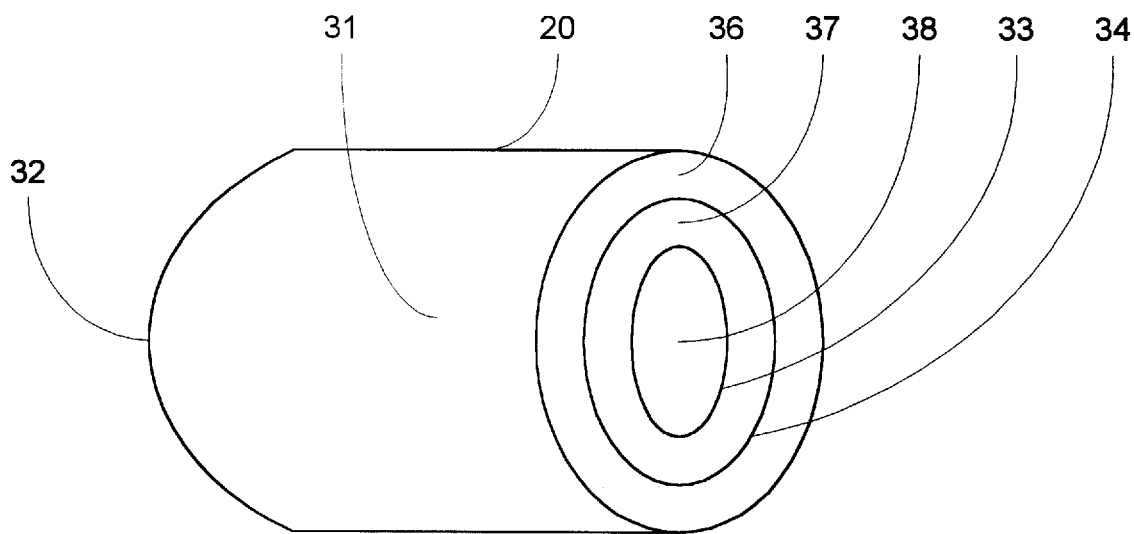
FIGS. 4A and 4B are schematic diagrams showing, respectively, front and rear views of a cathode configured in accordance with a second embodiment of the present invention.
Figure 4B:
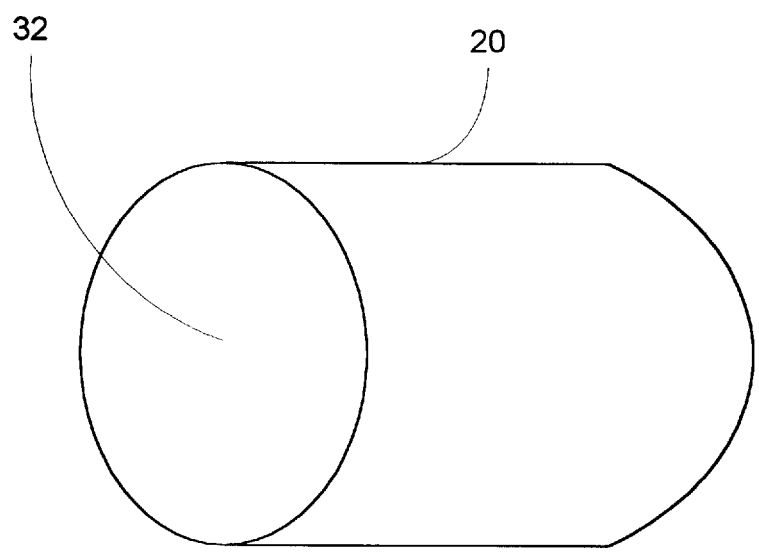

There are likewise no fundamental limitations on the specific size and shape of a cathode configured in accordance with the present invention. For example, the cathode can be a single-walled permeable wall hollow cathode or may include a plurality of nested, similarly shaped structures, all having permeable walls. FIGS. 4A and 4B illustrate front and rear views, respectively, of a second cathode embodiment that can be used to increase further the cathode's surface area with no increase in its physical dimensions. In this embodiment, the cathode 20 has a cylindrically shaped outer body wall 31, and two nested, similarly shaped inner body walls 33 and 34. The outer and inner body walls are made of a conductive material that is conductive to the reactive gas. The nested layers are separated from each other by open areas 36 and 37. The cathode has two ends: the end facing the is anode is open, while each of the nested layers are connected to each other and to the power supply on the other end 32, which, except for this electrical connection between the nested layers, can be either open or closed, as shown in FIG. 4B.

The embodiment illustrated in FIGS. 4A and 4B is not intended to be restrictive, but is simply one illustration of a nested configuration. With the exception of the requirements that one end of the cathode be open and that each nested layer be connected electrically to a power source (and practical size considerations imposed by the thickness of the permeable material and the desired size of the cathode), there are no fundamental limitations on the number of nested layers that can be used or on the size of the spaces between the layers. There is likewise no requirement that either end of the cathode be closed or that the nested layers be made of the same conductive, permeable material. Both ends of the cathode may be open and each of the nested layers may be made of the same or different conductive, permeable materials. The nested layers can, but need not be, electrically connected to one another. Each of the layers may be connected to the same power supply; alternatively a plurality of nested layers can be connected to a plurality of power supplies operating at different voltages.

Figure 5A:
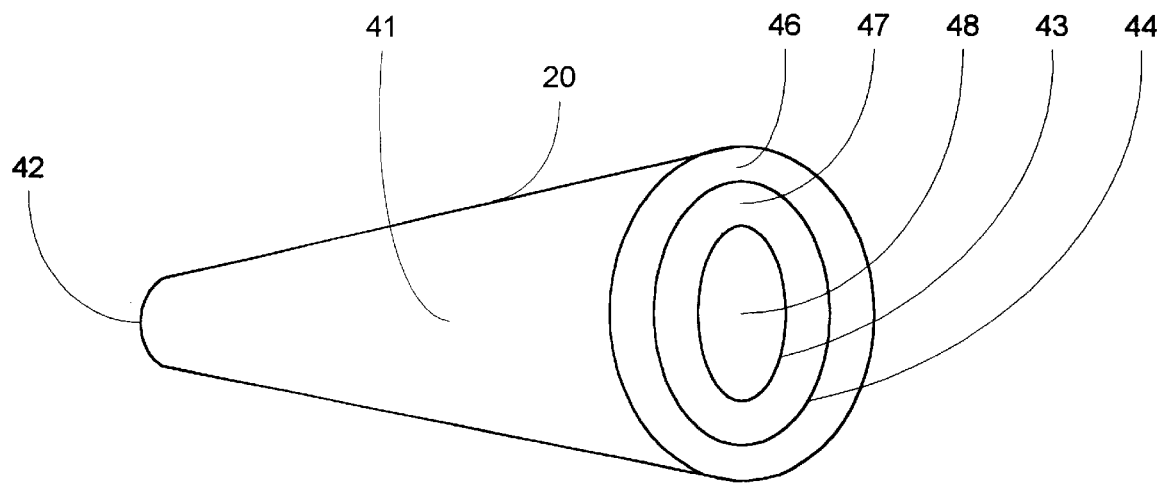
FIGS. 5A and 5B are schematic diagrams showing, respectively, front and rear views of a cathode configured in accordance with a third embodiment of the present invention.
Figure 5B:
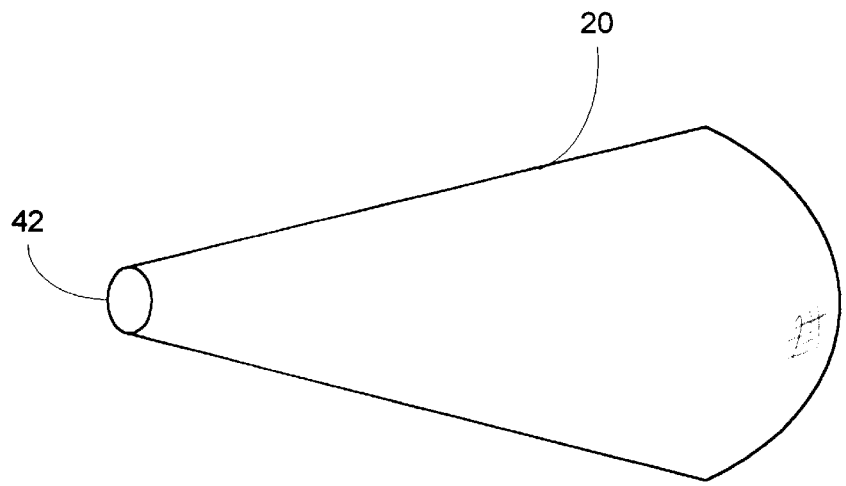

FIGS. 5A and 5B illustrate front and rear views, respectively, of a third cathode embodiment, which is another alternative embodiment of a nested configuration. In this embodiment, the cathode 20 has a cone shaped outer body wall 31, and two nested, similarly shaped inner body walls 43 and 44, both the outer and inner walls are made of a conductive, permeable material. The nested layers are separated from each other by open areas 46, 47, and 48. Due to the cone-shape of the nested body walls, the open areas become progressively smaller until all the layers come together at the base of the cone 42. At that point, all of the nested layers are connected to each other and to the power supply. The other end of the cathode is the open end of the cone.

Figure 6A:
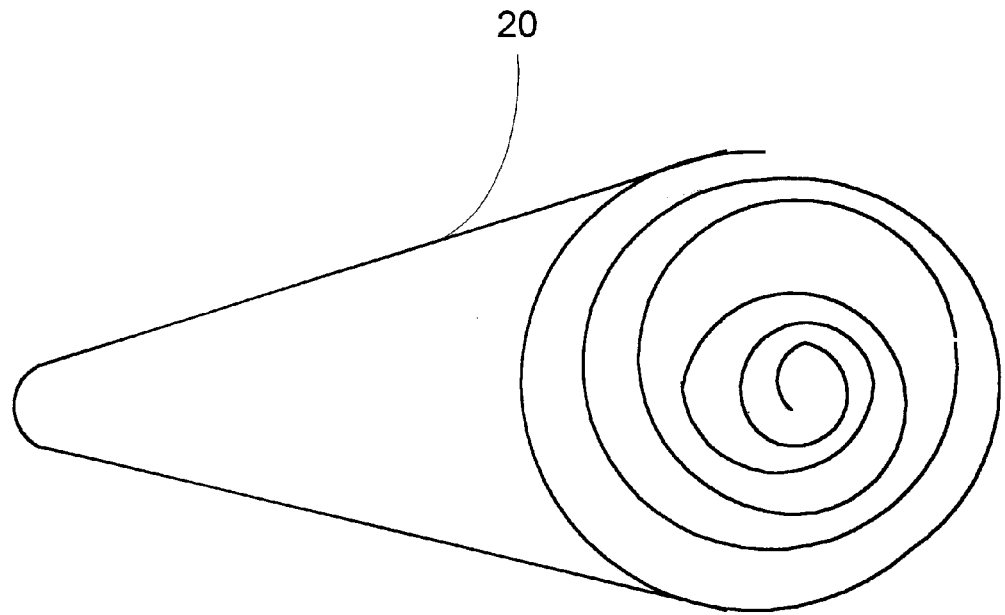
FIGS. 6A and 6B are schematic diagrams showing, respectively, front and rear views of a cathode configured in accordance with a fourth embodiment of the present invention.
Figure 6B:
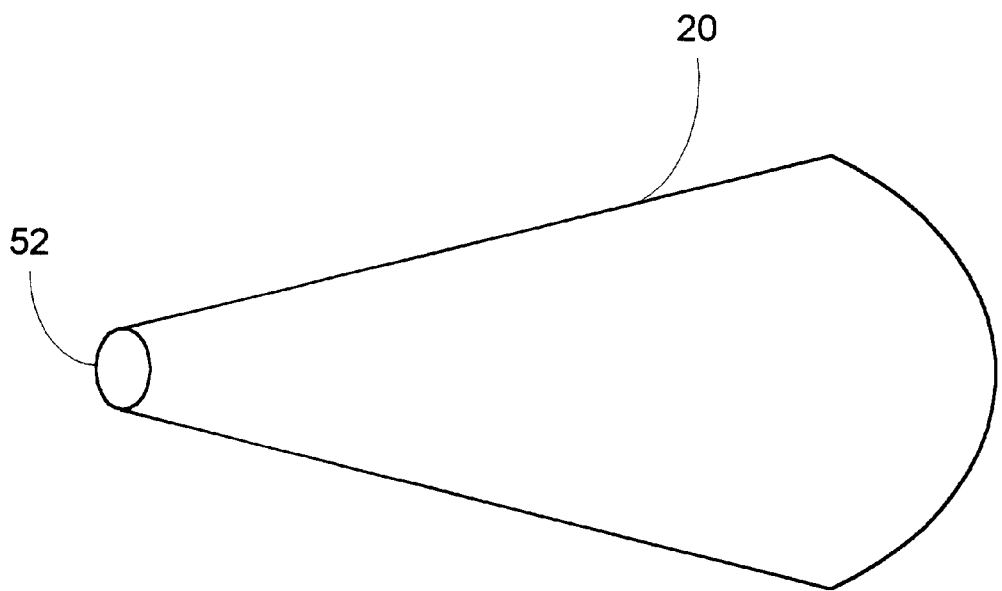

FIGS. 6A and 6B illustrate the front and rear views, respectively, of a fourth cathode embodiment. In this embodiment, the cathode 20 is formed from a single piece of permeable material in a spiral shape. The base of the spiral 52 is connected to the power supply. The other end of the spiral is the open end of the cathode.

The foregoing illustrative examples of cathode embodiments are not intended to limit in any way the generality of the present invention. In addition to the specific embodiments illustrated in the drawings, any geometrical configuration of permeable surfaces can be used so long as the cathode is connected to a power supply and open on the one end. The permeable surfaces in any chosen shape and size can also can be corrugated to further increase the available surface area.

A cathode according to the present invention can be made as follows: A length of stainless-steel mesh is wrapped around a mandrel having the desired shape (such as cylindrical). The length of mesh is cut to size, so that it has two adjoining edges running lengthwise of the mandrel. The two edges are spot welded or otherwise fastened together. One end of the shaped wire mesh tube is shaped into a cone by hand and is mounted within the discharge tube and attached to the power supply connection by conventional means such as welding or crimping. The mandrel is removed.

A nested, permeable wall cathode according to the present invention can be made by fashioning a set of cylinders of varying diameters. The cylindrical walls are concentrically welded to one side of a stainless steel plate, beginning with the smallest diameter cylinder. The plate is mounted within the discharge tube and attached to the power supply connection by conventional means such as welding or crimping.

The presently disclosed cathode allows the operating voltage of a gas discharge device to be decreased by at least 2-fold because of its greater electron emitting surface area. The permeable walls allow the free flow of the reactive gas and plasma and improve operating parameters such as pressure, temperature, and plasma stability.

While specific ways of making a cathode in accordance with the present invention are described, it should be understood that alternative ways are anticipated. Furthermore, it will be obvious to those skilled in the art that many variations and modifications may be made to the preferred embodiments as described above without substantially departing from the spirit and scope of the present invention. It is intended that all such variations and modifications be included within the scope of the present invention, as set forth in the following claims.

Now, therefore, the following is claimed:

1. A method for producing an electrode for use in a glow discharge device, comprising the steps of:

selecting at least one conductive material that is permeable to the gas in a glow discharge device;

fashioning said at least one conductive material into a plurality of elongated bodies having different diameters, each of said bodies having a substantially circular cross-section, at least a partially hollow interior, a first end, and a second end, said first end being open;

nesting each of said plurality of elongated bodies into a successively larger elongated body so that the bodies are substantially concentric and spaced from each other; and connecting one end of each of said plurality of elongated bodies to a connecting member about a common axis.

2. The method of claim 1, wherein said elongated bodies are concentric cones.

3. The method of claim 1, wherein said elongated bodies are concentric cylinders.

4. The method of claim 1, wherein said elongated bodies are concentric spirals.

5. A system for establishing a glow discharge in a gas, comprising:

an envelope containing a gas, said gas being capable of producing a glow discharge when stimulated by an electrical current;

a cathode in said envelope, said cathode comprising:

a body having an opening, said body comprising a plurality of layers constructed of at least one conductive material that is permeable to said gas, each of said plurality of layers having a different diameter, said layers being nested one within the other so that said layers are substantially concentric and spaced from one another, and means for supporting said plurality of nested layers;

an anode in said envelope; and means for inducing a flow of electrical current through said gas between said cathode and said anode.

6. The system of claim 5, wherein said layers are concentric cones.

7. The system of claim 5, wherein said layers are concentric cylinders.

8. The system of claim 5, wherein said layers are concentric spirals.

9. The system of claim 5, wherein the body of said cathode is a spiral shaped surface constructed of a conductive material that is permeable to said gas.

10. An electrode for use in a gas discharge tube, said electrode comprising:

a body having a first end and a second end, said first end being open, said body comprising a plurality of layers constructed of at least one conductive material that is permeable to the gas in the gas discharge tube, each of said plurality of layers having a different diameter, each of said layers being nested one within the other so that said layers are substantially concentric and spaced from each other, said body further comprising means for supporting said plurality of nested layers; and means for connecting said body to a power supply.

11. The electrode of claim 10, wherein said layers are concentric spirals.

12. The electrode of claim 10, wherein the body of said electrode is a spiral shaped surface constructed of a conductive material that is permeable to the gas.

13. The electrode of claim 10, wherein said layers are concentric cylinders.

14. The electrode of claim 10, wherein said layers are concentric cones.

* * * * *